Dec. 1, 1970 H. WEINERTH 3,544,397

METHOD FOR THE MANUFACTURING OF ZENER DIODES

Filed Jan. 4, 1968 2 Sheets-Sheet 1

INVENTOR
HANS WEINERTH

BY [signature]
ATTORNEY

METHOD FOR THE MANUFACTURING OF ZENER DIODES

Filed Jan. 4, 1968 2 Sheets-Sheet 2

INVENTOR
HANS WEINERTH

BY [signature]
ATTORNEY

United States Patent Office 3,544,397

Patented Dec. 1, 1970

3,544,397

METHOD FOR THE MANUFACTURING OF ZENER DIODES

Hans Weinerth, Freiburg, Germany, assignor to International Standard Electric Corporation, New York, N.Y., a corporation of Delaware Filed Jan. 4, 1968, Ser. No. 695,747
Claims priority, application Germany, Jan. 26, 1967, D 52,101
Int. Cl. H01l 7/46
U.S. Cl. 148—177 5 Claims

ABSTRACT OF THE DISCLOSURE

This is an invention for a method of manufacturing Zener diodes with breakdown voltages below 7 volts and optimum low differential resistance for the breakdown voltage by forming a zone at the surface of a substrate of opposite conductivity type than said substrate by the planar process, evaporating an alloying material on to said surface zone and of the same conductivity as said zone, and then alloying said material within a temperature gradient through the surface zone to a desired depth.

BACKGROUND OF THE INVENTION

The present invention relates to the economical manufacture of Zener diodes with relatively low breakdown voltages, in particular below 7 volts, and low differential resistances. In the course of this, sharp pn-junctions must be produced which can practically only be realized by way of alloying.

Zener diodes with low breakdown voltages could be manufactured, for example, by way of evaporating aluminium on to low-ohmic silicon of n-type conductivity, and by way of a subsequent alloying-in of the aluminium. The economical manufacture according to this relatively simple method, however, suffers from the fact that a surface treatment by way of etching subsequently to the alloying for the purpose of establishing a sharp characteristic and for the purpose reducing the reverse currents is unavoidable and cannot be carried out without strongly affecting the aluminium layer, and without protecting this layer with the aid of an etch-resistant medium. Instead of the evaporation and alloying of impurity substances or material into the semiconductor body, the impurity substance has in the past also been applied and alloyed in the form of balls or wires. But also in this case an etching after the alloying appears unavoidable.

SUMMARY OF THE INVENTION

The present invention relates to a method of manufacturing a Zener diode with a low breakdown voltage, in particular below 7 volts, and an optimum low differential resistance at the breakdown voltage. According to the present invention, the conventional methods are improved and made more economical by alloying a doping material through a surface zone produced by planar process, in the temperature gradient of a rising temperature, and in direction towards the inside of the crystal of a semiconductor body, said alloying material having the same conductivity type as the surface zone. Since voltage breakdown occurs first in the alloyed region, the voltage breakdown of the surface zone becomes noncritical, thus resulting in an improvement over the prior art because no subsequent treatment of the surface is required to protect the device.

IN THE DRAWINGS

DETAILED DESCRIPTION

Figure 1:
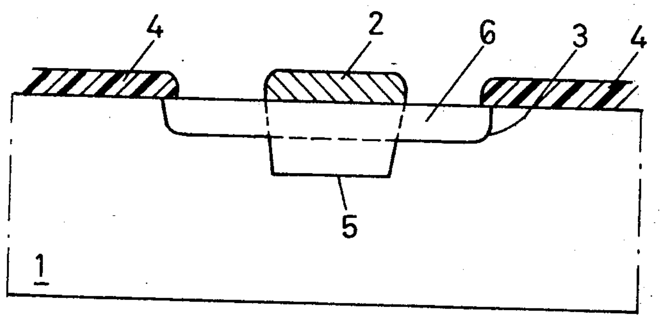
FIG. 1 shows the Zener diode with alloying material being alloyed into the diode through a temperature gradient.

FIG. 1, sectionally shows a Zener diode with a breakdown voltage of about 7 volts at the p+n-junction 5 continuing towards the surface of the semiconductor body of an n-conducting silicon in the pn-junction 3 with a breakdown voltage of 20 volts.

In manufacturing the Zener diode, where a plurality of diodes are processed simultaneously on one common wafer, the p-conducting zone is formed by diffusing p-type material to a depth of 5 to 10$\mu$ into the n-conducting silicon body in accordance with the well-known planar process as disclosed by the U.S. Patent No. 3,025,589 by employing the masking oxide film 4.

Thereupon the amount of alloy 2 consisting of aluminium in a thickness of 7 to 10$\mu$ is evaporated, as shown in FIG. 1. Although it might be obvious to evaporate the aluminium through a perforated mask it is preferred, in the interest of obtaining a better marginal sharpness, to evaporate the entire surface and, by employing the well-known photolithographic process and a suitable etching agent, to apply the amount of alloy with the suitable geometry. In order to alloy the amount of alloying material 2 through the p-conducting zones 6 down to a depth of 15$\mu$, there is now employed, in accordance with the method of the present invention, the alloying within the temperature gradient.

Figure 2:
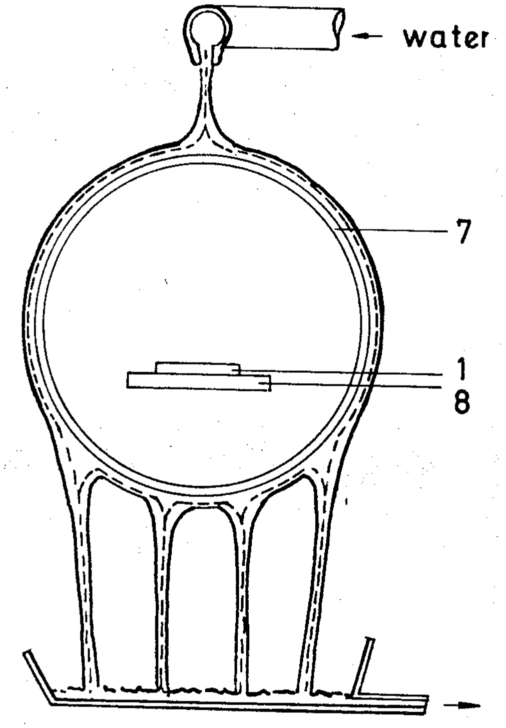
FIG. 2 shows the apparatus used to manufacture the Zener diode.

To this end the semiconductor wafer 1, positioned in a protective gas atmosphere, is arranged in a water-cooled quartz 7 container on a graphite base 8, which is kept at a regulated temperature ranging between 1000° and 1200° C. as shown in FIG. 2. In order to avoid a flow of the alloy material and nonuniform alloying fronts, the temperature gradient must be adhered to in a reproducible manner. This is accomplished by regulating the surface temperature of the silicon wafers. During the heat treatment there appears a bending through of the wafer 1 by lifting the edge or marginal area off the graphite base 8. Since this results in a component of the temperature gradient extending parallel in relation to the semiconductor surface, the alloying contacts migrate or travel on the semiconductor wafer at all points where this component appears. This undesirable effect is prevented in that the wafer is pressed to the graphite base.

By employing the method according to the present invention there is obtainable a Zener diode having a low breakdown voltage, and requiring no subsequent treatment of the surface whatsoever. Since the guard ring zone 6 has been diffused relatively far into the semiconductor body, there will result in spite of the normally high surface concentrations which are customary in the normal types of diffusion processes, a relatively high breakdown voltage of about 20 volts for the pn-junction 3, which is so excessively high with respect to the breakdown voltage of p+n-junction 5 that irregularities of the surface will no longer have a disturbing effect. Accordingly, in order to achieve this, it is no longer necessary to lower the surface concentration, with the aid of special steps and measures, below the solubility concentration level which is only slightly temperature dependent. Of course, instead of the advantage of a no longer required treatment, there results the problem of a particularly deep alloying-in. This problem, however, can be solved with a relatively small expenditure by performing an alloying within the temperature gradient. Accordingly, the process according to the present invention may be considered as being particularly economical.

Figure 3:
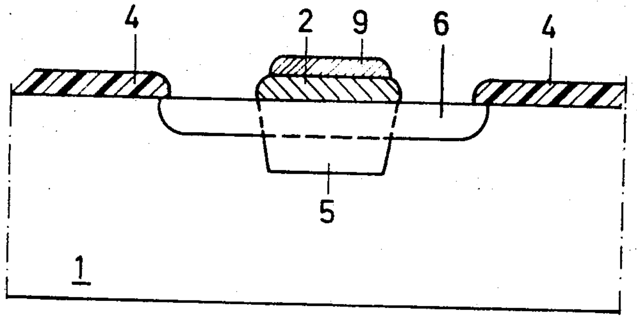
FIG. 3 shows the Zener diode with the electrode of alloying material coated with a layer of silver.

In order to obtain the optimum low differential resistance which is dependent upon the breakdown voltage, and which is achievable with the aid of the method according to the present invention, it is necessary that the contacts have a low contact resistance. In a view toward an ecomonical manufacturing process, pressure contacts are preferred. In order to be able, with respect to the present example of embodiment of Zener diodes comprising aluminium alloy contacts, to manufacture pressure contacts having a low contact resistance as shown in FIG. 3, aluminium 2 is evaporated through a suitable mask on to the alloy contacts in a thickness of about 0.1$\mu$ in the vacuum, and immediately thereafter, reinforces or strengthened by the application of a layer of silver 9 of equal thickness through the same mask but from another source of evaporation within the vacuum recipient. Thereupon, the layer or film of silver is tempered at a relatively low temperature of about 450° C., which results in a reduction of the contact resistance. After a galvanic strengthening of the contacts and the cutting or dividing of the plate into individual elements, a resilient pressure contact is applied to the strengthened electrode when the individual element is inserted in a sleeve or envelope.

It is to be understood that the foregoing description of specific examples of this invention is made by way of example only and is not to be considered as a limitation on its scope.

What is claimed is:

1. A method of producing a low voltage Zener diode having a Zener voltage below 7 volts and an optimum low differential resistance for the breakdown voltage comprising the steps of:

forming a surface zone in a substrate of semiconductor material, said surface zone being of opposite conductivity type from the conductivity type of said substrate;

regulating the surface temperature of said substrate; pressing said substrate onto a graphite base; and alloying doping material of the same conductivity type as said surface zone in through said surface zone within a temperature gradient of an increasing temperature in a direction toward the inside of said substrate in order to avoid a flow of alloy material to nonuniform alloying fronts so as to obtain reproducible alloyed regions that are tapered toward a central axis of said substrate, said central axis being perpendicular to said surface.

2. A method according to claim 1, wherein in the case of an n-conducting silicon substrate, aluminium is alloyed-in as the doping material, forming a pn-junction within said substrate and a contact area at the surface of said substrate.

3. A method according to claim 2, wherein said contact area is strengthened by evaporating aluminium onto said contact area through a mask in vacuum in layer thickness of 0.1$\mu$ and then evaporating silver onto said layer of aluminium through the same said mask in layer thickness of 0.1$\mu$.

4. A method according to claim 3, wherein said silver layer is tempered at a temperature of 450° C.

5. A method according to claim 2, wherein said temperature treatment is caried out within a protective gas atmosphere within a water-cooled quartz container on said graphite base, said graphite base being heated to a temperature ranging between 1000° C. and 1200° C.

References Cited

UNITED STATES PATENTS 3,457,469 7/1969 Lawrence ---------- 148—177

RICHARD O. DEAN, Primary Examiner

U.S. Cl. X.R.

148—33, 33.3, 179, 180, 181, 185; 317—234